United States Patent
Feldtkeller

(10) Patent No.: US 11,616,445 B2
(45) Date of Patent: Mar. 28, 2023

(54) METHOD FOR DRIVING A SWITCH IN A POWER CONVERTER, DRIVE CIRCUIT AND POWER CONVERTER

(71) Applicant: Infineon Technologies Austria AG, Villach (AT)

(72) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 1 day.

(21) Appl. No.: 16/860,475

(22) Filed: Apr. 28, 2020

(65) Prior Publication Data

US 2020/0382005 A1    Dec. 3, 2020

(30) Foreign Application Priority Data

May 29, 2019  (EP) ..................................... 19177203

(51) Int. Cl.
*H02M 3/335*    (2006.01)
*H02M 1/32*    (2007.01)
*H02M 1/00*    (2006.01)

(52) U.S. Cl.
CPC ......... *H02M 3/33507* (2013.01); *H02M 1/32* (2013.01); *H02M 1/0009* (2021.05); *H02M 1/0058* (2021.05)

(58) Field of Classification Search
CPC .................. H02M 1/0009; H02M 1/32; H02M 3/335–33592; H02H 7/1213
See application file for complete search history.

(56) References Cited

U.S. PATENT DOCUMENTS

| | | | | |
|---|---|---|---|---|
| 5,784,231 A | * | 7/1998 | Majid ................... | H02H 7/1213 363/56.11 |
| 2008/0278973 A1 | * | 11/2008 | Lin ..................... | H02M 3/33523 363/21.08 |
| 2009/0257251 A1 | * | 10/2009 | Su ...................... | H02M 3/33523 363/21.15 |
| 2011/0095733 A1 | * | 4/2011 | Park .................... | H02M 1/4225 323/207 |
| 2011/0141778 A1 | * | 6/2011 | Wu ...................... | H02M 1/4225 363/95 |
| 2014/0016378 A1 | * | 1/2014 | Ke ...................... | H02M 3/33523 363/21.18 |

(Continued)

OTHER PUBLICATIONS

EP Search Report, EP 19177203.7, dated Dec. 5, 2019, pp. 6.

*Primary Examiner* — Fred E Finch, III
(74) *Attorney, Agent, or Firm* — Armis IP Law, LLC

(57) ABSTRACT

A method for operating a switch in a power converter, a drive circuit for operating a switch in a power converter, and a power converter are disclosed. The method includes: driving an electronic switch coupled to an inductor in a power converter based on a feedback signal ($S_{FB}$) and a crossing detection voltage, wherein the feedback signal is dependent on an output parameter of the power converter and the crossing detection voltage is dependent on a voltage across an auxiliary winding coupled to the inductor; clamping the crossing detection voltage; monitoring an auxiliary current ($I_{AUX}$) associated with clamping the crossing detection voltage; and detecting an overvoltage when the monitored current reaches a predefined threshold.

18 Claims, 8 Drawing Sheets

(56) References Cited

U.S. PATENT DOCUMENTS

| | | |
|---|---|---|
| 2015/0280575 A1 | 1/2015 | Song et al. |
| 2015/0043252 A1 | 2/2015 | Kuang |
| 2017/0163026 A1* | 6/2017 | Yang .................. H02M 1/44 |
| 2019/0103807 A1* | 4/2019 | Chen ............ H02M 3/33507 |
| 2020/0212813 A1* | 7/2020 | Chen .................. H02M 1/32 |

* cited by examiner

METHOD FOR DRIVING A SWITCH IN A POWER CONVERTER, DRIVE CIRCUIT AND POWER CONVERTER

RELATED APPLICATION

This application claims priority to earlier filed European Patent Application Serial Number EP19177203.7 entitled "METHOD FOR DRIVING A SWITCH IN A POWER CONVERTER, DRIVE CIRCUIT AND POWER CONVERTER," filed on May 29, 2019, the entire teachings of which are incorporated herein by this reference.

BACKGROUND

Switched-mode power converters, which are briefly referred to as power converters in the following, are widely used in various kinds of power supply application. A power converter is configured to convert input power (which is given by an input current multiplied with an input voltage) received from a power source into output power (which is given by an output current multiplied with an output voltage) supplied to a load. Power converters are available with various kinds of topologies. Some converter types such as, for example, flyback converters, buck converters, or boost converters, include an inductor, an electronic switch connected in series with the inductor, and a drive circuit (control circuit) configured to the drive the electronic switch. The drive circuit is part of a control loop that may be configured to regulate the output voltage or the output current by a switched-mode operation of the electronic switch.

BRIEF DESCRIPTION OF EMBODIMENTS

Due to variations of a power consumption of the load the output voltage may vary. Usually, the control loop may counteract such variations by suitably controlling the switch. A defect in the control loop, however, may result in an uncontrolled increase of the output voltage. It is therefore desirable to monitor the output voltage in order to be able to take suitable measures, such as deactivating the electronic switch, when the output voltage reaches the threshold.

One example embodiments herein relates to a method. The method includes driving an electronic switch coupled to an inductor in a power converter based on a feedback signal and a crossing detection voltage, wherein the feedback signal is dependent on an output parameter of the power converter and the crossing detection voltage is dependent on a voltage across an auxiliary winding coupled to the inductor. The method further includes clamping the crossing detection voltage, monitoring an auxiliary current associated with clamping the crossing detection voltage, and detecting an overvoltage when the monitored current reaches a predefined threshold.

Another example embodiments herein relates to a drive circuit. The drive circuit is configured to drive an electronic switch connected in series with an inductor in a power converter based on a feedback signal received at a first input of the drive circuit and a crossing detection voltage received at a second input of the drive circuit, clamp the crossing detection voltage, monitor an auxiliary current associated with clamping the crossing detection voltage, and detecting an overvoltage based on monitoring the auxiliary current.

Embodiments herein include a method comprising: driving an electronic switch based on a feedback signal and a received voltage, the electronic switch coupled to an inductor in a power converter, the feedback signal being dependent on an output parameter of the power converter, the received voltage being dependent on an auxiliary voltage supplied by an auxiliary winding coupled to the inductor;
clamping the received voltage;
monitoring an auxiliary current associated with clamping the received voltage;
detecting an overvoltage when the monitored auxiliary current reaches a predefined threshold;
the method further comprising: monitoring a first current through the electronic switch when the electronic switch is in an on-state, the first current determined from a voltage across a first resistor connected in series with the electronic switch; and
wherein monitoring the auxiliary current comprises monitoring the auxiliary current when the electronic switch is in an off-state, monitoring of the auxiliary current including driving a second current that is dependent on the auxiliary current at least through the first resistor and monitoring a voltage at least across the first resistor.

Further embodiments herein include: driving the second current that is dependent on the auxiliary current through the first resistor and a second resistor coupled to the first resistor; and monitoring a voltage across the first resistor and the second resistor.

Further embodiments herein include: wherein limiting the received voltage comprises limiting a voltage across the auxiliary winding to a voltage level of below 500 mV.

Further embodiments herein include, wherein detecting the overvoltage comprises detecting the overvoltage when the auxiliary current is detected as being higher than a predefined threshold for longer than a predefined time period.

Further embodiments herein include wherein driving the electronic switch comprises driving the electronic switch in a plurality of successive drive cycles; and wherein detecting the overvoltage comprises detecting the overvoltage when the auxiliary current is higher than a predefined threshold in each of a predefined number of successive drive cycles.

Yet further embodiments herein include an apparatus comprising:
a drive circuit operative to:
drive an electronic switch based on: i) a feedback signal received at a first input of the drive circuit and ii) a first voltage received at a second input of the drive circuit, the electronic switch connected in series with an inductor of a power converter;
clamp the first voltage to a predefined threshold;
monitor an auxiliary current associated with clamping the first voltage, the auxiliary current being a first current; and
detect an overvoltage based on monitoring the auxiliary current;
the drive circuit further operative to:
monitor a current through the electronic switch when the electronic switch is in an on-state, the first current determined from a voltage across a first resistor connected in series with the electronic switch; and
monitor the auxiliary current when the electronic switch is in an off-state, monitor of the auxiliary current including driving a second current that is dependent on the auxiliary current at least through the first resistor and monitoring a voltage at least across the first resistor.

In accordance with further example embodiments, the drive circuit comprises an integrated circuit and wherein the first resistor is a discrete component externally connected to the integrated circuit.

In accordance with further example embodiments, the apparatus includes: an electronic switch is connected to the inductor and driven by the drive circuit.

In accordance with further example embodiments, the apparatus includes a second resistor connected between a first circuit node of the drive circuit and the first resistor

BRIEF DESCRIPTION OF DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF EMBODIMENTS

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
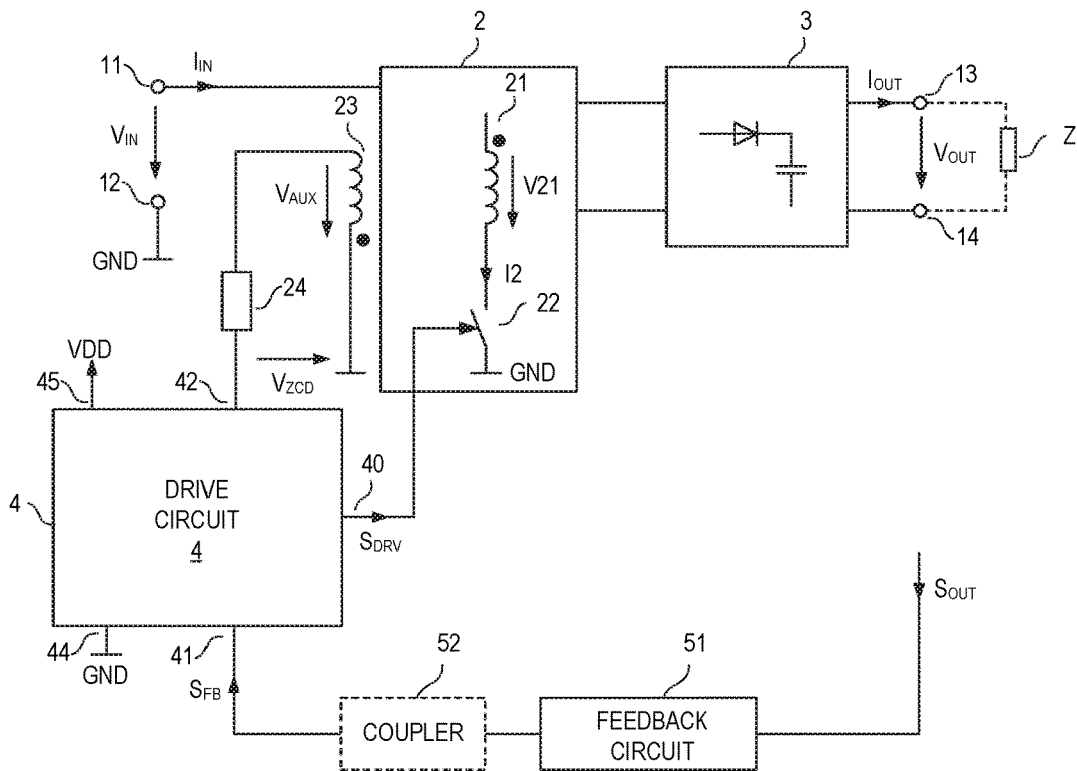
FIG. 1 illustrates one example of a power converter according to embodiments herein.

FIG. 1 schematically illustrates one example of a power converter circuit according to embodiments herein. This power converter circuit is configured to receive an input voltage $V_{IN}$ and an input current $I_{IN}$ at an input having a first input node 11 and a second input node 12 and to provide an output voltage $V_{OUT}$ and an output current $I_{OUT}$ at an output 13, 14. The power converter may be configured to regulate an output parameter such as the output voltage $V_{OUT}$, the output current $I_{OUT}$, or an output power (which is given by the output voltage $V_{OUT}$ multiplied by the output current $I_{OUT}$) such that the output parameter has a predefined value.

Referring to FIG. 1, the power converter includes a switching circuit 2 connected to the input 11, 12 and a rectifier circuit 3 connected between the switching stage 2 and the output 13, 14. The switching circuit 2 includes an electronic switch 22 and an inductor 21 coupled to the electronic switch 22. The electronic switch 22 is controlled by a drive signal $S_{DRV}$ received at a drive input of the electronic switch 22 such that the electronic switch 22 switches on or off dependent on the drive signal $S_{DRV}$. According to one example, the inductor 21 is connected in series with a load path of the electronic switch 22 so that the same current I2 flows through the electronic switch 22 and the inductor 21. The electronic switch 22 is configured to conduct a current when the drive signal $S_{DRV}$ switches on the electronic switch 22 (so that the electronic 22 is in an on-state) and is configured to block when the drive signal $S_{DRV}$ switches off the electronic switch 22 (so that the electronic switch 22 is in an off-state). Any type of electronic switch such as a MOSFET (Metal Oxide Semiconductor Field-Effect Transistor), an IGBT (Insulated Gate Bipolar Transistor), a HEMT (High Electron-Mobility Transistor), or the like, may be used to implement electronic switch 22.

Referring to FIG. 1, the power converter further includes an auxiliary winding 23. The auxiliary winding is magnetically coupled to the inductor 21, so that a voltage $V_{AUX}$ across the auxiliary winding 23 is essentially proportional to a voltage V21 across the inductor 21, wherein a proportionality factor between the auxiliary voltage $V_{AUX}$ and the voltage V21 across the inductor 21 is dependent on a ratio between a number of turns of the auxiliary winding 23 and a number of turns of the inductor 21. The switching circuit 2 may include further circuit elements and may be coupled to the rectifier circuit 3 in various ways. Different examples are explained herein further below.

According to one example, the inductor 21 is coupled to the rectifier circuit 3 in such a way that in a certain operating states of the power converter the voltage V21 across the inductor 21 is representative of the output voltage $V_{OUT}$. In this case, the auxiliary voltage $V_{AUX}$ is representative of the output voltage $V_{OUT}$. According to one example, the operating state in which the voltage V21 across the inductor 21 is representative of the output voltage $V_{OUT}$ is an operating state of the power converter in which the electronic switch 22 is switched off (that is, the electronic switch is in an off-state).

Referring to FIG. 1, the power converter further includes a feedback circuit 51. The feedback circuit 51 receives an output signal $S_{OUT}$ that represents the output parameter that is to be regulated. That is, the output signal $S_{OUT}$ may represent the output voltage $V_{OUT}$, the output current $I_{OUT}$, or the output power $P_{OUT}$. According to one example, the output signal $S_{OUT}$ represents the output voltage $V_{OUT}$ and is essentially proportional to the output voltage $V_{OUT}$. According to another example the output signal $S_{OUT}$ represents the output current $I_{OUT}$ and is essentially proportional to the output current $I_{OUT}$. The output signal $S_{OUT}$ may be obtained by measuring the respective output parameter in a conventional way using any kind of voltage, current or power measurement circuit. Such circuits are commonly known, so that no further explanation is required in this regard.

The feedback circuit 51 is configured to generate a feedback signal $S_{FB}$ based on the output signal $S_{OUT}$. A drive circuit 4 receives the feedback signal $S_{FB}$ at a first input 41 and is configured to generate the drive signal $S_{DRV}$ at an output 40 based on the feedback signal $S_{FB}$. Referring to FIG. 1, a load Z (illustrated in dashed lines) connected to the output 13, 14 may receive the output voltage $V_{OUT}$ and the output current $I_{OUT}$. Dependent on a power consumption of the load Z the regulated output parameter, such as the output voltage $V_{OUT}$ or the output current $I_{OUT}$, may vary. The feedback circuit 51 is configured to generate the feedback signal $S_{FB}$ in such a way that the feedback signal $S_{FB}$—based on which the electronic switch 22 is driven—counteracts such variations of the regulated output parameter. More specifically, the feedback signal is generated in such a way that, in a steady state of the power converter, the input power, which is controlled by the switched-mode operation of the electronic switch 22, essentially equals the output power received by the load Z. The feedback circuit 51 and the drive circuit 4 form a control loop that is configured to regulate the output parameter.

Regulating the output parameter may include regulating the output parameter such that the output parameter has a predefined value (level). According to one example, the feedback circuit 51 compares the output signal $S_{OUT}$ with a reference signal that represents the predefined value, calculates an error signal based on comparing the output signal $S_{OUT}$ with the reference signal, and generates the feedback signal $S_{FB}$ based on the error signal. Generating the feedback signal $S_{FB}$ based on the error signal $S_{ERR}$ may include filtering the error signal $S_{ERR}$ using a filter with any one of a proportional (P) characteristic, an integral (I) characteristic, a proportional-integral (PI) characteristic or a proportional-integrative, derivative (PID) characteristic. Generating a feedback signal in power converter based on an error signal is commonly known so that no further explanation is required in this regard.

Dependent on the specific implementation of the switching circuit 2 and its coupling to the rectifier circuit 3 the switching circuit 2 and the rectifier circuit 3 may be coupled in such way that the input voltage $V_{IN}$ and the output voltage $V_{OUT}$ are referenced to the same ground potential. According to another example, the switching circuit 2 and the rectifier circuit 3 provide for a galvanic isolation between the input 11, 12 and the output 13, 14. In case there is a galvanic isolation between the input 11, 12 and the output 13, 14 the power converter may further include a coupler 52 connected between the feedback circuit 51 and the drive circuit 4. This coupler 52 is configured to transmit the feedback signal $S_{FB}$ from the feedback circuit 51 via the galvanic isolation to the drive circuit 4. The coupler 52 may include an optocoupler, an inductive coupler, a capacitive coupler, or the like.

Referring to the above, the power converter may be configured in such a way and may be operated in such a way that the auxiliary voltage $V_{AUX}$ in certain operating states of the power converter represents the output voltage $V_{OUT}$. Further, as explained above, the output voltage $V_{OUT}$ may vary dependent on a power consumption of the load Z, wherein the control loop counteracts such variations of the output voltage $V_{OUT}$. In case of a fault in the control loop, however, the output voltage $V_{OUT}$ may increase in an uncontrolled fashion. According to one example, the auxiliary voltage $V_{AUX}$ is used to detect an overvoltage at the output 13, 14 in order to be able to promptly react on such overvoltage. More specifically, a voltage $V_{ZCD}$ derived from the auxiliary voltage $V_{AUX}$ is used to detect an overvoltage at the output. This voltage $V_{ZCD}$ is referred to as crossing detection voltage (a.k.a. received voltage) in the following, because this voltage $V_{ZCD}$ may further be used to detect time instances when a voltage V21 across the inductor 21 crosses a certain threshold, such as zero. This is explained in detail herein further below.

Referring to FIG. 1, the crossing detection voltage $V_{ZCD}$ may be a voltage that is referenced to the same circuit node as the auxiliary voltage $V_{AUX}$. According to one example, this circuit node is the second input node 12. This second input node is also referred to a ground GND node in the following.

Figure 2:
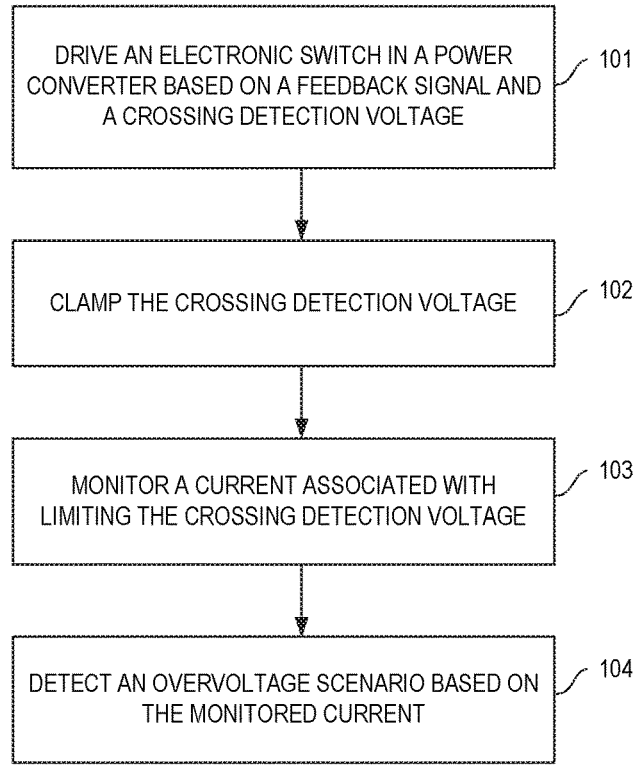
FIG. 2 illustrates one example of a method for detecting an overvoltage at an output of a power converter according to embodiments herein.

A block diagram of a method for driving the electronic switch 22 based on the feedback signal $S_{FB}$ and the crossing detection voltage $V_{ZCD}$ (received voltage), and detecting an overvoltage at the output 13, 14 based on the crossing detection voltage $V_{ZCD}$, is illustrated in FIG. 2 according to embodiments herein.

Referring to FIG. 2, the method includes driving an electronic switch, such as the electronic switch 22 shown in FIG. 1, in a power converter based on a feedback signal, such as the feedback signal $S_{FB}$ shown in FIG. 1, and a crossing detection voltage, such as the crossing detection voltage $V_{ZCD}$ shown in FIG. 1 (101). The method further includes clamping the crossing detection voltage (102), monitoring a current associated with clamping the crossing detection voltage (103), and detecting an overvoltage scenario based on the monitored current. This monitored current is also referred to as auxiliary current or crossing detection current in the following.

Figure 3:
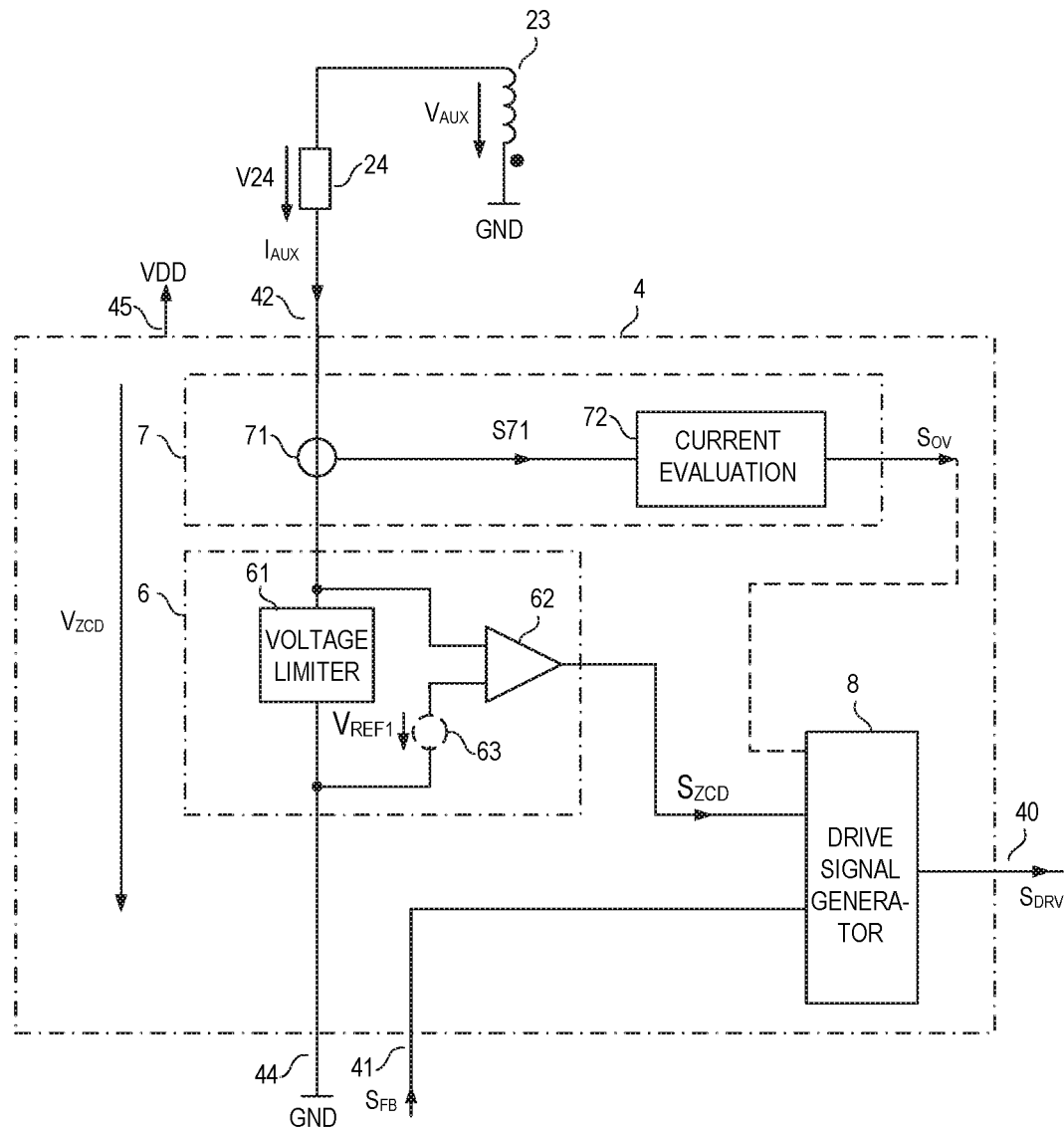
FIG. 3 illustrates one example of a drive circuit of the power converter shown in FIG. 1 according to embodiments herein.

FIG. 3 illustrates one example of a drive circuit 4 that is configured to drive the electronic switch 22 in the way explained with reference to FIG. 2 according to embodiments herein. It should be noted that the block diagram illustrated in FIG. 3 illustrates functional blocks of the drive circuit 4 rather than a specific implementation. Those functional blocks can be implemented in various ways. According to one example, these functional blocks are implemented using dedicated circuits, wherein these circuits may include analog circuits, digital circuits, or mixed circuits including analog and digital circuits. According to another example the drive circuit 4 is implemented using hardware and software. For example, the drive circuit 4 may include a microcontroller and software executed by the microcontroller.

Referring to FIG. 3, the drive circuit 4 includes a crossing detection circuit 6. The crossing detection circuit 6 is configured to receive the crossing detection voltage $V_{ZCD}$ via the second input 42 of the drive circuit 4 and is configured to clamp the crossing detection voltage $V_{ZDC}$. Further, the crossing detection circuit 6 is configured to compare the crossing detection voltage $V_{ZDC}$ with a first reference voltage $V_{REF1}$ in order to detect time periods in which the crossing detection voltage $V_{ZCD}$ crosses the first reference voltage $V_{REF1}$. For clamping the auxiliary voltage $V_{AUX}$, the crossing detection circuit 6 includes a voltage limiter 61, and, for comparing the crossing detection voltage $V_{ZCD}$ with the first reference voltage $V_{REF1}$, the crossing detection circuit 6 includes a comparator 62.

A crossing detection signal $S_{ZCD}$ output by the comparator 62 represents those time instances at which the crossing detection voltage $V_{ZCD}$ crosses the first reference voltage $V_{REF1}$. More specifically, the crossing detection signal $S_{ZCD}$ may be generated by the crossing detection circuit 6 in such a way that rising and falling edges of the crossing detection signal $S_{ZCD}$ occur each time the crossing detection voltage $V_{ZCD}$ crosses the first reference voltage $V_{REF1}$, wherein one of a rising edge and a falling edge occurs when the crossing detection voltage $V_{ZCD}$ crosses the first reference voltage $V_{REF1}$ in a first direction and the other one of the rising edge and the falling edge occurs when the crossing detection voltage $V_{ZCD}$ crosses the first reference voltage $V_{REF1}$ in the opposite direction. The reference voltage $V_{REF1}$ is provided by a reference voltage source 63.

According to one example, the first reference voltage $V_{REF1}$ is zero so that the crossing detection signal $S_{ZCD}$ represents those time instances at which the crossing detection voltage $V_{ZCD}$ crosses zero. In this case, the crossing detection signal $S_{ZCD}$ may be referred to as zero crossing detection signal. Further, in this case, the voltage source 63 may be omitted. Referring to FIG. 3, a resistor 24 may be connected between the auxiliary winding 23 and the crossing detection circuit 6, so that the crossing detection voltage $V_{ZCD}$ is given by the auxiliary voltage $V_{AUX}$ minus a voltage V24 across the resistor 24. Due to voltage limiter 61 the crossing detection voltage $V_{ZCD}$ is not proportional to the auxiliary voltage $V_{AUX}$. However, the crossing detection voltage $V_{ZCD}$ turns zero each time the auxiliary voltage $V_{AUX}$ turns zero. Thus, the crossing detection voltage $V_{ZCD}$ can be used to detect time instances when the auxiliary voltage $V_{AUX}$ crosses zero.

When the crossing detection voltage $V_{ZDC}$ is higher than the voltage limit defined by the voltage limiter 61, an auxiliary current $I_{AUX}$ flows through the voltage limiter 61. In the example shown in FIG. 3, a magnitude of the auxiliary current $I_{AUX}$ is essentially given by $$I_{AUX} = \frac{V24}{R24} = \frac{V_{AUX} - V_{LIM}}{R24}, \quad (1)$$

where R24 is a resistance of the resistor 24, and $V_{LIM}$ is a voltage limit (clamping voltage) of the voltage limiter, wherein this voltage limit may be essentially constant. As can be seen from equation (1), the auxiliary current $I_{AUX}$ increases as the auxiliary voltage $V_{AUX}$ increases, wherein, as outlined above, the auxiliary voltage $V_{AUX}$ may be representative of the output voltage $V_{OUT}$ in certain operating states. Thus, the auxiliary current $I_{AUX}$ is suitable to detect an overvoltage at the output 13, 14.

Referring to FIG. 3, a monitoring circuit 7 monitors the auxiliary current $I_{AUX}$ and outputs an overvoltage signal $S_{OV}$ based on monitoring the auxiliary current $I_{AUX}$. The overvoltage signal $S_{OV}$ may have one of two different signal levels, (a) a first signal level, which is referred to as fault level in the following, indicates that an overvoltage has been detected, and (b) a second signal level, which may be referred to as normal level in the following, indicates that an overvoltage has not been detected. Referring to FIG. 3, the monitoring circuit 7 may include a current sensor 71 that is configured to measure the auxiliary current $I_{AUX}$ and provide a current measurement signal S71 that represents the auxiliary current $I_{AUX}$. Further, the monitoring circuit 7 may include an evaluation circuit 72 that receives the current measurement signal S71 and generates the overvoltage signal $S_{OV}$ based on comparing the current measurement signal S71 with a reference signal.

Referring to FIG. 3, the drive circuit 4 may further include a drive signal generator 8 that receives the crossing detection signal $S_{ZCD}$ and the feedback signal $S_{FB}$ and that generates the drive signal $S_{DRV}$ based on these signals. Optionally, the drive signal generator 8 may further receive the overvoltage signal $S_{OV}$ in order to drive the electronic switch 22 based on the overvoltage signal $S_{OV}$ in addition to the crossing detection signal $S_{ZCD}$ and the feedback signal $S_{FB}$.

Figure 4:
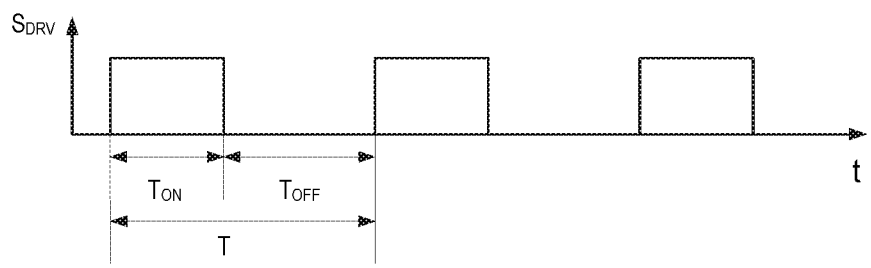
FIG. 4 shows one example of a signal diagram of a drive signal generated by the drive circuit according to embodiments herein.

FIG. 4 schematically illustrates a timing diagram of the drive signal $S_{DRV}$ generated by the drive circuit 4 according to embodiments herein. Referring to FIG. 4, the drive signal $S_{DRV}$ includes a plurality of successive drive periods. Each drive period includes an on-period in which the drive signal $S_{DRV}$ has an on-level that switches on the electronic switch 22, and an off-period in which the drive signal $S_{DRV}$ has an off-level that switches off the electronic switch 22. Just for the purpose of illustration, the on-level is a high signal level in the example illustrated in FIG. 4, and the off-level is a low signal level of the drive signal $S_{DRV}$. The drive circuit 4 may be configured to vary at least one of a duration $T_{ON}$ of the on-period in the individual drive cycles and a duration $T_{OFF}$ of the off-period of the individual drive cycles in order to regulate the output parameter. The switching circuit 2 may be implemented in such a way that energy is stored in the inductor 21 in each on-period and that the stored energy is transferred to the rectifier circuit 3 in each off-period.

Figure 5:
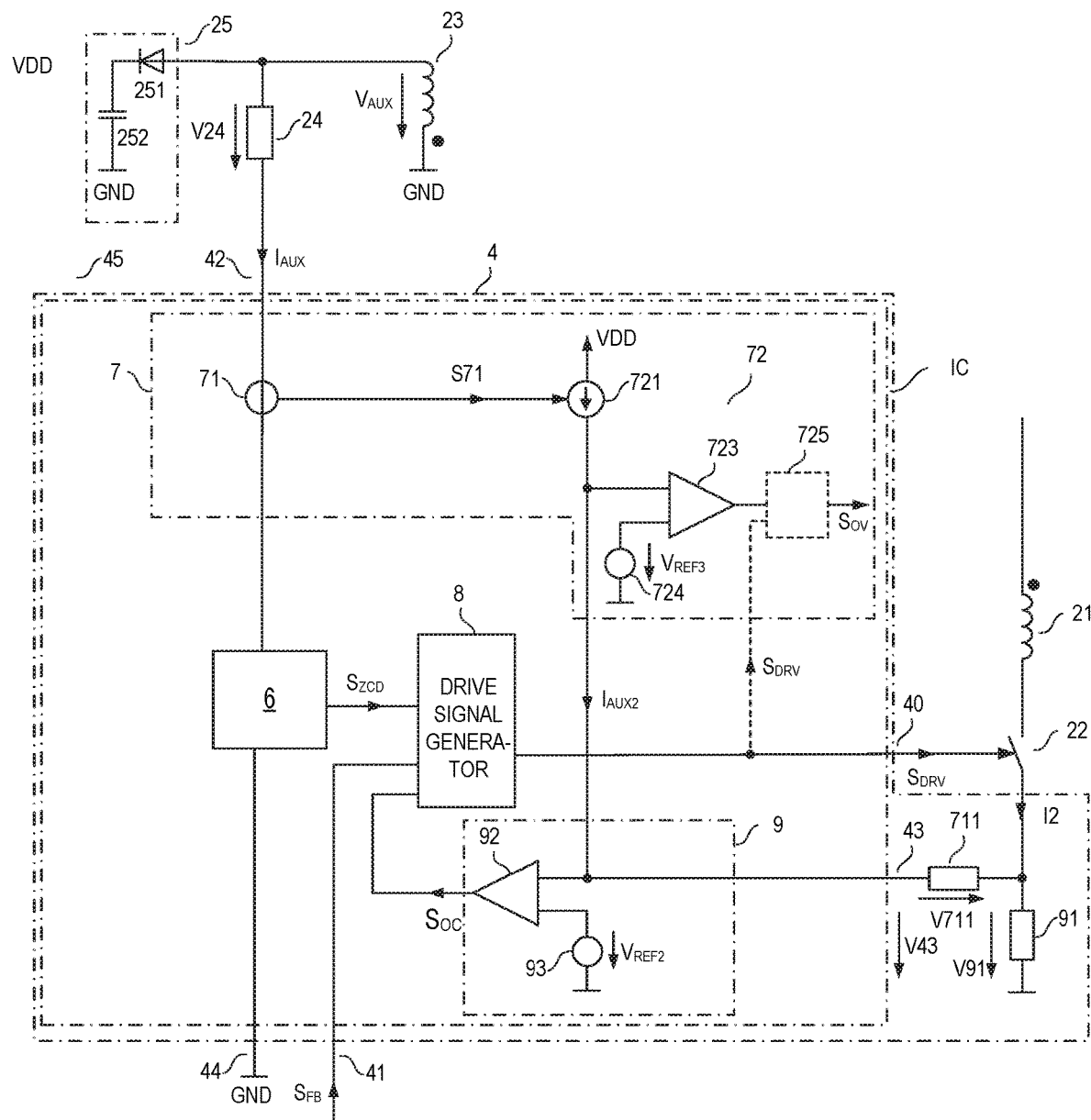
FIG. 5 illustrates one example of a monitoring circuit of the drive circuit shown in FIG. 3 in greater detail according to embodiments herein.

FIG. 5 illustrates a modification of the drive circuit 4 shown in FIG. 3 according to embodiments herein. The drive circuit 4 according to FIG. 5 is further configured to monitor the current I2 through the electronic switch 22 by monitoring a voltage V91 across a first resistor 91 connected in series with the electronic switch 22. A load current monitoring circuit 9 is configured to compare the voltage V91 across the first resistor 91 with a second reference voltage $V_{REF2}$ provided by a reference voltage source 93 and to generate an overcurrent signal $S_{OC}$ based on comparing the voltage V91 across the first resistor 91 with the second reference voltage $V_{REF2}$. A comparator 92 compares the voltage V91 across the first resistor 91 with the second reference voltage $V_{REF2}$ and outputs the overcurrent signal $S_{OC}$. According to one example, the overcurrent signal $S_{OC}$ either has a first level, which is referred to as overcurrent level in the following, and a second level, which is referred to as normal level in the following. The comparator 92 is configured to generate the overcurrent level of the overcurrent signal $S_{OC}$ when the voltage V91 across the first resistor 91 is higher than the second reference voltage $V_{REF2}$. The drive signal generator 8 receives the overcurrent signal $S_{OC}$ and may be configured to immediately switch off the electronic switch 22 when the overcurrent signal $S_{OC}$ indicates that an overcurrent scenario has occurred.

In the drive circuit 4 shown in FIG. 5, the evaluation circuit 72 of the auxiliary current monitoring circuit 7 includes a second resistor 711 that is connected between a first circuit node 43 and the first resistor 91. More specifically, the second resistor 711 is connected between the first circuit node 43 and a circuit node at which the first resistor 91 can be connected to the electronic switch 22. Further, the evaluation circuit 72 includes a controlled current source 721 that receives the current measurement signal S71 and is configured to drive a current $I_{AUX2}$ via the first circuit node 43 through the second resistor 711 and the first resistor 91 when the electronic switch 22 is in the off-state. According to one example, this current $I_{AUX2}$ is proportional to the auxiliary current $I_{AUX}$ and is therefore referred to as further auxiliary current $I_{AUX2}$ in the following.

According to one example, a resistance R711 of the second resistor 711 is significantly higher than a resistance R91 of the first resistor 91. According to one example, a ratio R711/R91 between these resistances is greater than 1000 (1E3) or greater than 10000 (1E4). The resistance R711 of the second resistor 711 is between 1 kiloohm (kΩ) and 10 kΩ, for example, and the resistance R91 of the first resistor 91 is between 0.1 ohms (Ω) and 1Ω, for example.

A voltage V43 at the first circuit node 43, that is, a voltage across a series circuit including the first resistor 91 and the second resistor 711 is given by a voltage V91 across the first resistor 91 plus a voltage V711 across the second resistor 711. When the electronic switch 22 is in the off-state, the current I2 through the electronic switch 22 is zero so that the voltage V43 at the first circuit node 43 is only dependent on the further auxiliary current $I_{AUX2}$. (The comparator 91 has a high input impedance so that the further auxiliary current $I_{AUX2}$ essentially only flows through the two resistors 91, 711). The evaluation circuit 72 is configured to compare the voltage V43 at the first circuit node 43 with a third reference voltage $V_{REF3}$ provided by a reference voltage source 724 and output the overvoltage signal $S_{OV}$. More specifically, a comparator 723 compares the input voltage V43 with the third reference voltage $V_{REF3}$ and outputs the overvoltage signal $S_{OV}$. In this drive circuit 4, the signal level of the auxiliary current $I_{AUX}$ at which an overvoltage level of the overvoltage signal $S_{OV}$ is generated can be adjusted by suitably adjusting a ratio between the auxiliary current $I_{AUX}$ and the further current auxiliary current $I_{AUX2}$ and by suitably selecting a resistance of the second resistor 711.

The drive circuit 4 may include an integrated circuit IC wherein the voltage limiter 6 and the drive signal generator 8 may be integrated in the integrated circuit IC. Further, the monitoring circuit 7 except for the second resistor 711 and the load current monitoring circuit 9 except for the first resistor 91 may be integrated in the integrated circuit IC. Thus, the first resistor 91 and the second resistor 72 may be discrete devices externally connected to the integrated circuit IC. The first and second inputs 41, 42 and the supply inputs 44, 45 of the drive circuit 4 may be formed by respective input pins of the integrated circuit IC and the output 40 may be formed by an output pin of the integrated circuit IC. Further, the first circuit node 43 may be formed by a further input pin of the integrated circuit IC. In this case, for connecting the first resistor 91 and the second resistor 711 to the integrated circuit IC of the drive circuit 4 the same input pin of the integrated circuit IC can be used, so that for the overcurrent detection, which uses the first resistor 91, and the overvoltage detection, which uses the first resistor 91 and the second resistor 92, the same input pin can be used. In an integrated circuit each additional input pin (or output pin) is associated with additional costs.

According to one example, the monitoring circuit 7 is configured to generate the further auxiliary current $I_{AUX2}$ only when the auxiliary voltage $V_{AUX}$ has a certain polarity that only occurs when the electronic switch 22 is in the off-state. In this way, when the electronic switch 22 is in the on-state, the voltage V43 received at the first circuit node 43 equals the voltage V91 across the first resistor 91, because in this operating state the further auxiliary current $I_{AUX2}$ and, therefore, the voltage V711 across the second resistor 711 is zero. When the electronic switch 22 is in the off-state, the current I2 through the electronic switch 22 is zero. In this operating state, the input voltage V43 at the third input 43 is only given by the further auxiliary current $I_{AUX2}$ and by resistances R711, R91 of the first and second resistor 711, 91.

According to one example, the overvoltage signal $S_{OV}$ is not the output signal of the comparator 723, but is generated by an evaluation circuit 725 based on the comparator output signal. The evaluation circuit 725 may be configured to generate the overvoltage level of the overvoltage signal $S_{OV}$ only when the comparator output signal indicates that the input voltage V43 at the first circuit node 43 is higher than the third reference voltage $V_{REF3}$ longer than a predefined time period. In this way, voltage spikes of the auxiliary voltage $V_{AUX}$ and, therefore, current spikes of the auxiliary current $I_{AUX}$ that may occur in transition phases of the electronic switch 22 from the on-state to the off-state, or vice versa, do not result in an erroneous detection of an overvoltage scenario. Alternatively or additionally, the evaluation circuit 725 may be configured to generate the overvoltage level of the overvoltage signal $S_{OV}$ only when the voltage V43 at the first circuit node 43 is higher than the third reference voltage $V_{REF3}$ in a predefined number of successive drive cycles of the electronic switch 22. According to one example, in a combination of the two examples explained above, the evaluation circuit 725 may be configured to generate an overvoltage level of the overvoltage signal $S_{OV}$ only generated when the input voltage V43 is higher than the third reference voltage $V_{REF3}$ for longer than the predefined time period in each of a predefined number of successive drive cycles. The evaluation circuit 725 may receive the drive signal $S_{DRV}$ in order to be able to detect when a new drive cycle starts.

Referring to FIGS. 1, 3 and 5, the drive circuit 4 may further receive a supply voltage VDD between supply nodes 44, 45, wherein one of these supply nodes may be connected to the ground node GND. The supply voltage VDD supplies the individual circuit blocks in the drive circuit 4. Referring to FIG. 5, the drive voltage VDD may be generated based on the auxiliary voltage $V_{AUX}$ using a rectifier circuit 25, that may include rectifier element 251 and a capacitor 252. However, generating the supply voltage VDD based on the auxiliary voltage $V_{AUX}$ is only an example. According to another example (not shown) a further auxiliary winding coupled to the inductor 21 may be used to generate the supply voltage VDD.

Figure 6:
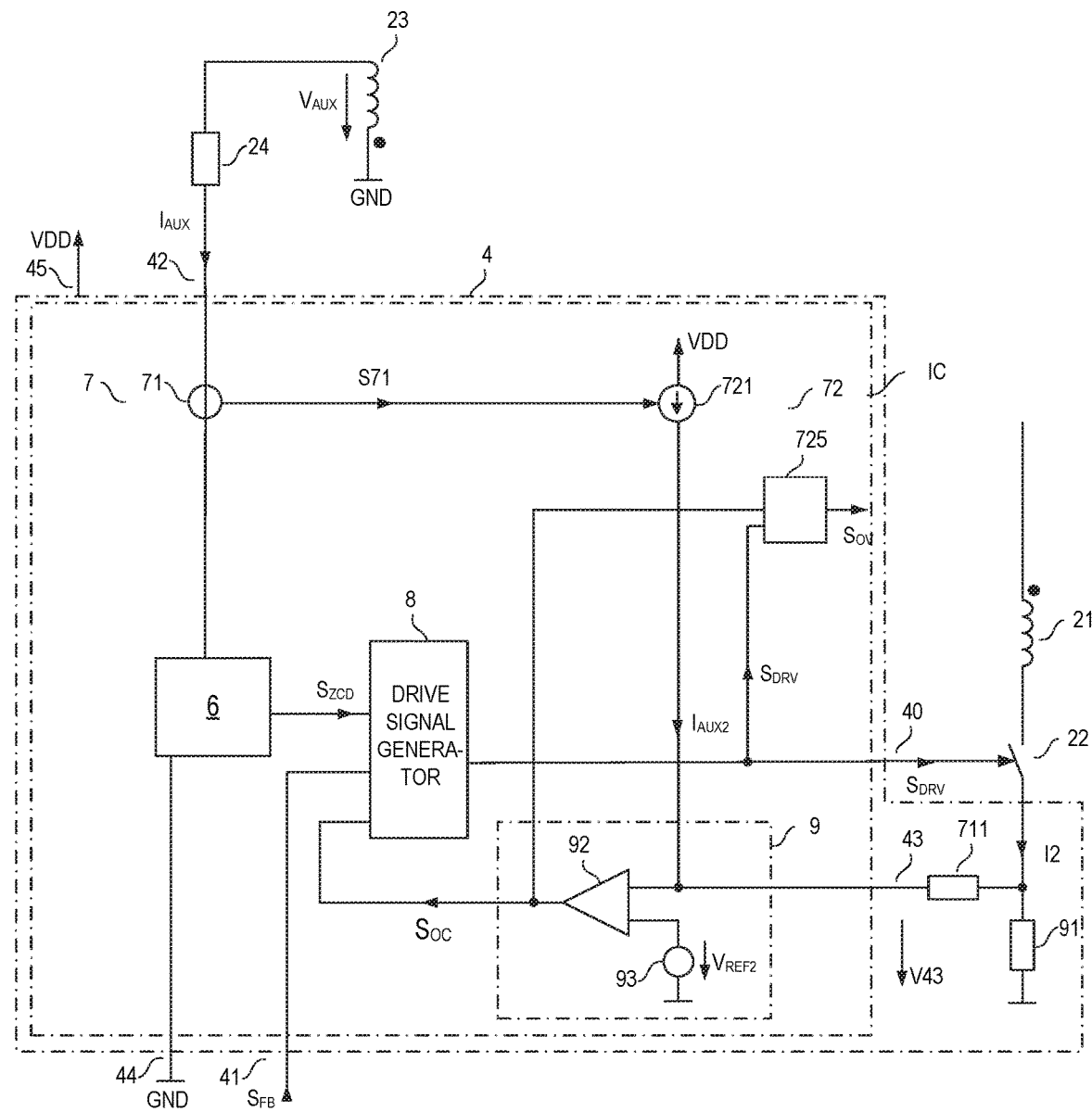
FIG. 6 shows a modification of the drive circuit shown in FIG. 4 according to embodiments herein.

FIG. 6 illustrates a modification of the drive circuit shown in FIG. 5 according to embodiments herein. In the example shown in FIG. 6, the voltage V43 at the third input is only compared with the second reference voltage $V_{REF2}$. In this example, the output signal of the comparator 92 is used for both overcurrent and overvoltage detection purposes. More specifically, the output signal of the comparator 92 is the overcurrent signal $S_{OC}$ when the electronic switch 22 is in the on-state, and the output signal of the comparator 92 is processed by the evaluation circuit 725 in order to generate the overvoltage signal $S_{OV}$ when the electronic switch 22 is in the off-state.

Figure 7:
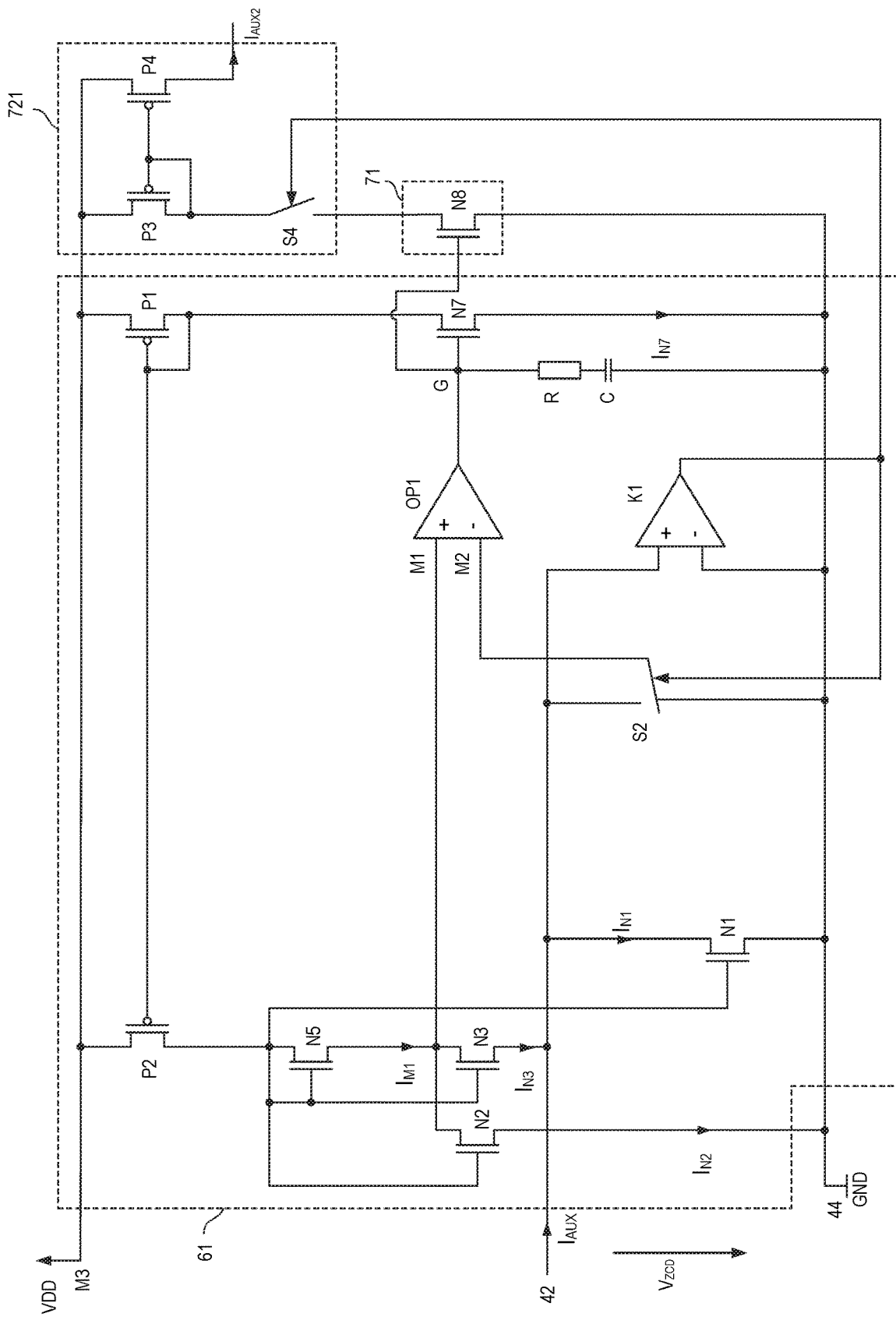
FIG. 7 illustrates a circuit diagram of one example a crossing detection circuit and a current sensor in one of the drive circuits shown in FIGS. 5 and 6 according to embodiments herein.

FIG. 7 illustrates one example of the voltage limiter 61, the current sensor 71 and the current source 721 in greater detail. In this example, the voltage limiter 61 includes a first transistor N1 connected between the second input node 42 and the ground node 44 of the drive circuit 4. The first transistor N1 clamps the crossing detection voltage $V_{ZCD}$. Driving the first transistor N1 in an on-state so that it clamps the crossing detection voltage $V_{ZCD}$ is explained in detail herein further below.

The voltage limiter 61 further includes a second transistor N2 connected between a first circuit node M1 and the ground node 12, and a third transistor N3 connected between the first circuit node M1 and the second input node 42. Further, a current regulator is configured to control a current $I_{M1}$ into the first circuit node M1 in two different ways dependent on a polarity of the auxiliary voltage $V_{AUX}$. The current into the first circuit node is provided from a supply node M3 where the supply voltage VDD is available. When the auxiliary voltage $V_{AUX}$ has a first polarity, the regulator controls the current $I_{M1}$ into the first circuit node M1 such that the first transistor N1 and the second transistor N2 are operated in the same operating point and a current $I_{N3}$ through the third transistor N3 is zero. In this case, a current level of a current $I_{N2}$ through the second transistor N2 is proportional to a current $I_{N1}$ through the first transistor N1, wherein the current $I_{N1}$ through the first transistor N1 equals the auxiliary current $I_{AUX}$. According to one example, the first transistor N1 and the second transistor N2 have the same length and the same width. In this case, the current $I_{N2}$ through the second transistor N2 and the auxiliary current $I_{AUX}$ have the same current level.

According to one example, the regulator includes an operational amplifier OP1 that has a first input connected to the first circuit node M1 and second input connected to a second circuit node M2. A switch S2 that is controlled by a comparator K1 connects the second circuit node M2 to the second input 42 when the auxiliary voltage $V_{AUX}$ has the first polarity. In this case, the operational amplifier OP1 controls the current $I_{M1}$ into the first circuit node M1 such that the potential at the first circuit node M1 equals the potential at the second input 42, so that a voltage across the third transistor N3 is zero. Thus, as mentioned above, the current $I_{N3}$ through the third transistor N3 is zero.

The regulator further includes a variable resistor N7 driven by the operational amplifier OP1 and connected between the supply node M3 and the ground node 12, and a current mirror P1, P2. According to one example, the variable resistor N7 includes a transistor driven by the operational amplifier. Optionally, a filter R, C is connected between an output of the operational amplifier OP1 and the transistor of the variable resistor N7.

The current mirror P1, P2 is configured to mirror a current $I_{N7}$ through the variable resistor N7 such that the current $I_{M1}$ into the first circuit node M1 is proportional to the current $I_{N7}$ through the variable resistor N7, wherein a proportionality factor between the current through the variable resistor N7 and the current $I_{M1}$ into the first circuit node M1 is given by a current mirror ratio of the current mirror. According to one example, the current mirror ratio is 1:1, so that the current $I_{M1}$ into the first circuit M1 equals the current $I_{N7}$ through the variable resistor N7. The regulator, via the variable resistor N7 and the current mirror P1, P2, adjusts the current $I_{M1}$ into the first circuit node M1 such that the current $I_{N3}$ through the third transistor N3 is zero, so that—in a steady state of the regulator—the current $I_{M1}$ into the first circuit node M1 equals the current $I_{N2}$ through the second transistor N2, wherein the latter is proportional to the auxiliary current $I_{AUX}$. Thus, given the proportionality between the current $I_{M1}$ into the first circuit node M1 and the current $I_{N7}$ through the variable resistor N7, the current through the variable resistor N7 is proportional to the auxiliary current $I_{AUX}$. This current $I_{N7}$ through the variable resistor N7 represents the current measurement signal S71 mentioned above.

Referring to FIG. 7, the voltage limiter 61 further includes a further transistor N5 connected between an output transistor P2 of the current mirror P1, P2 and the first circuit node M1. This further transistor N5 is connected as a diode. That is, a drain node of the further transistor N5 is connected to its gate node. Further, gate nodes of the first, second and third transistors N1, N2, N3 are connected to the drain/gate node of the further transistor, so that these transistors N1, N2, N3 have the same electrical potential at their respective gate node. The first transistor N1 and the second transistor N2 are activated, so that they may conduct a current, as soon as the potential at their respective gate node reaches a level at which gate-source voltage of these transistors N1, N2 becomes higher than the respective threshold voltages. According to one example, the first, second and third transistor N1-N3 have the same threshold voltage. The threshold voltage of the fifth transistor N5 may be lower than the threshold voltages of the first, second and third transistor N1, N2, N3.

The clamping voltage, which is the voltage level at which the crossing detection voltage $V_{ZCD}$ is clamped by the voltage limiter 61, is predefined, but not fixed. This clamping voltage is defined by the characteristic curve of the first transistor N1 and is dependent on a current level of the auxiliary current $I_{AUX}$. Thus, at each voltage level of the auxiliary voltage $V_{AUX}$ the clamping voltage is predefined by the first transistor N1, but not fixed. Basically, the higher the auxiliary current $I_{AUX}$ the higher the clamping voltage. However, there is a square relationship between the clamping voltage and the auxiliary current $I_{AUX}$ so that variations of the clamping voltage dependent on the auxiliary current $I_{AUX}$ are essentially negligible.

According to one example, the first transistor N1 is implemented such that a voltage drop across the first transistor N1 is less than 5% or even less than 2% of the auxiliary voltage $V_{AUX}$ during the demagnetization phase. In this case, despite variations, a magnitude of the crossing detection voltage $V_{ZCD}$ is almost negligible compared to the magnitude of the auxiliary voltage $V_{AUX}$, so that in each case the auxiliary current $I_{AUX}$ is essentially proportional to the auxiliary voltage $V_{AUX}$.

Referring to FIG. 7, the current sensor 71 includes a further transistor N6 that is coupled to the variable resistor N7 and the current source 721 includes a further current mirror P3, P4 that is configured to generate the further auxiliary current $I_{AUX2}$ such that the further auxiliary current $I_{AUX2}$ is proportional to the current $I_{N7}$ through the variable resistor N7. The further current mirror may include a switch S4 controlled by the comparator K1, wherein the comparator K1 may be configured to close this switch S4 only when the crossing detection voltage $V_{ZCD}$ has the first polarity, so that the further auxiliary current $I_{AUX2}$ is only provided when the electronic switch 22 is in the off-state.

When the crossing detection voltage $V_{ZCD}$ has the second polarity, the switch S2 controlled by the comparator K1 connects the second circuit node M2 to the ground node 44. In this case, the operational amplifier OP1 controls the current $I_{M1}$ into the first circuit node M1 such that the potential at the first circuit node M1 equals the potential at the ground node 44. Thus, the voltage across the second transistor N2 is zero and the voltage across the third transistor N3 equals the crossing detection voltage $V_{ZCD}$. Thus, the current $I_{N2}$ through the second transistor N2 is zero and the third transistor N3 is operated in the same operating point as the first transistor N1, so that the current IN3 through the third transistor N3 is proportional to the current $I_{N1}$ through the first transistor N1. The further auxiliary current, however, is zero because the switch S4 in the current source 721 is switched off by the comparator.

Figure 8:
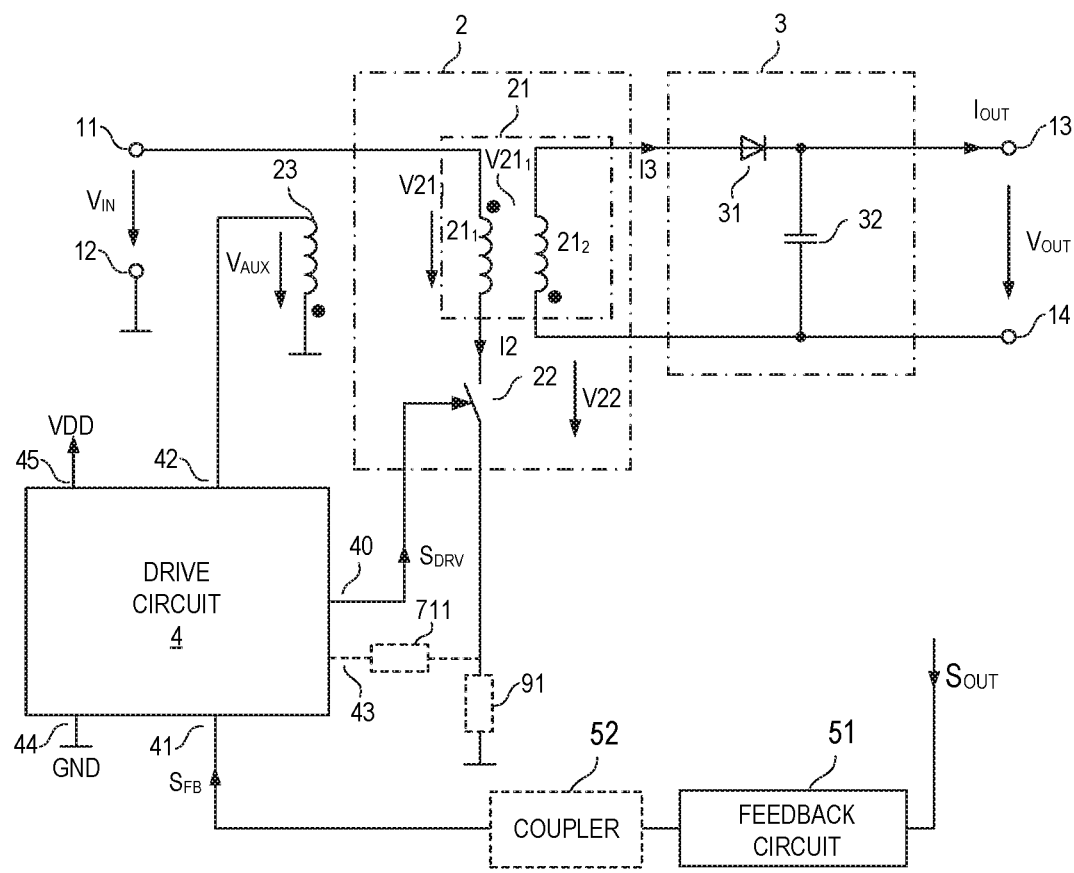
FIG. 8 shows a power converter with a flyback topology according to embodiments herein.

Referring to the above, a drive circuit of the type explained before may be used to drive an electronic switch in power converters with various kinds of topologies. One example of a power converter is illustrated in greater detail in FIG. 8 according to embodiments herein. In this example, the power converter has a flyback topology. In this case, the inductor 21 is a transformer with a primary winding $21_1$ and a secondary winding $21_2$. The primary winding $21_1$ is connected in series with the electronic switch 22, wherein the series circuit with the primary winding $21_1$ and the electronic switch 22 is connected between a first node 11 and a second node 12 of the input 11, 12. The secondary winding $21_2$ is connected to the rectifier circuit 3. In this example, the rectifier 3 includes a rectifier element 31, such as a diode, and a capacitor 32, wherein the output voltage $V_{OUT}$ is available across the capacitor 32.

Figure 9:
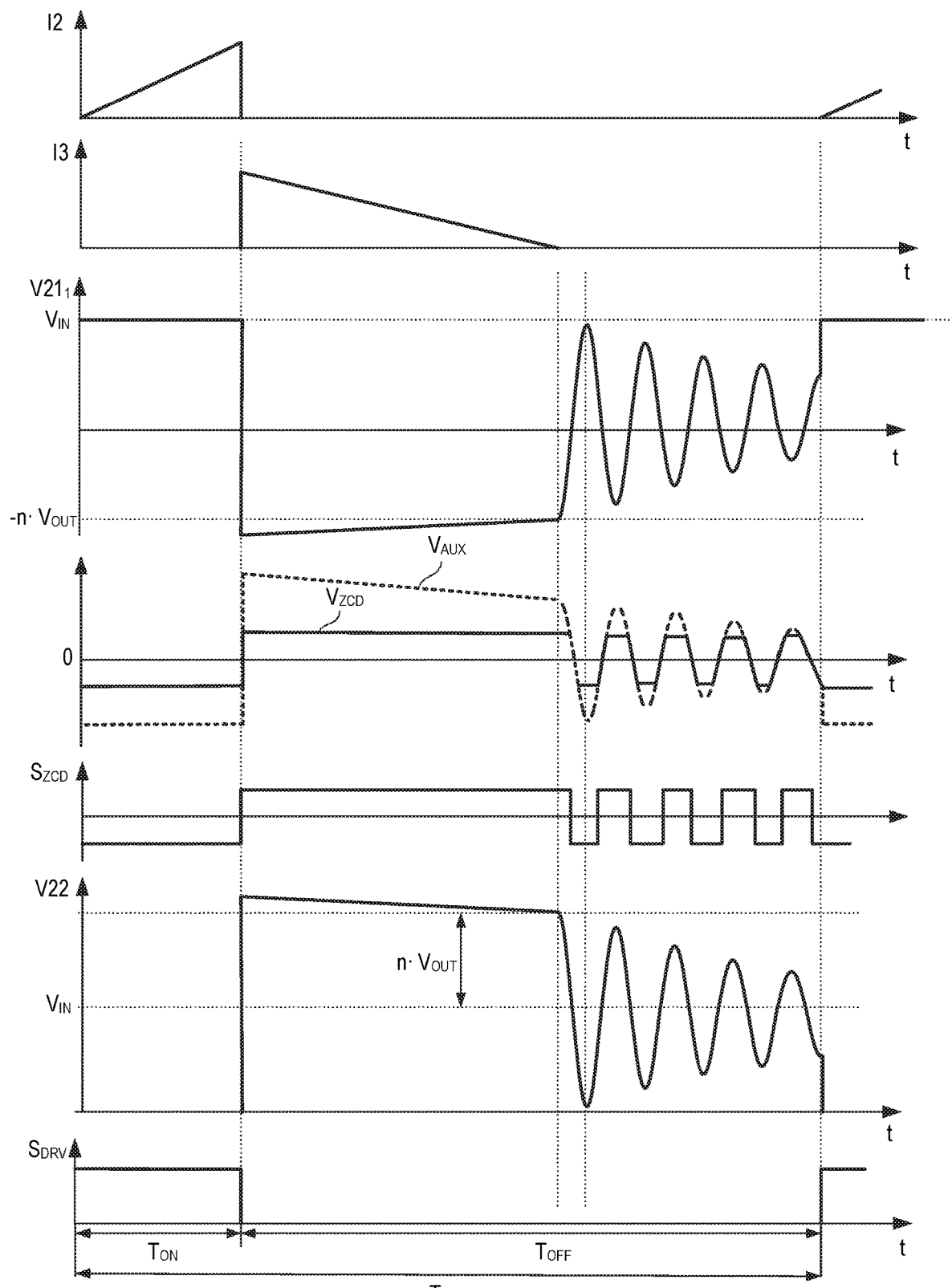
FIG. 9 shows signal diagrams of signals occurring in the power converter shown in FIG. 8 according to embodiments herein.

FIG. 9 shows, according to embodiments herein, timing diagrams that illustrate the current I2 through the electronic switch 22, the current I3 through the rectifier circuit 3, the voltage $V21_1$ across the primary winding of the transformer 21, the auxiliary voltage $V_{AUX}$, the crossing detection voltage $V_{ZCD}$, the crossing detection signal $S_{ZCD}$, the voltage V22 across the electronic switch 22, and the drive signal $S_{DRV}$ in one drive cycle of the power converter. When the electronic switch 22 is in the on-state, that is, during the on-period $T_{ON}$, the current through the primary winding $21_1$ and the electronic switch 22 increases (wherein an increase of the current I2 is essentially proportional to the input voltage $V_{IN}$ and inversely proportional to an inductance of the transformer 21). During the on-period, the voltage $V21_1$ across the primary winding $21_1$ essentially equals the input voltage $V_{IN}$. The voltage $V21_1$ across the primary winding $21_1$ is also referred to as primary voltage in the following. In the example illustrated in FIG. 8, the primary winding $21_1$ and the auxiliary winding 23 have opposite winding senses. Thus, during the on-period $T_{ON}$, the auxiliary voltage $V_{AUX}$ has a polarity that is opposite the polarity of the voltage across the primary winding $21_1$. In the example illustrated in FIGS. 8 and 9, the auxiliary voltage $V_{AUX}$ is negative during the on-period $T_{ON}$.

The auxiliary voltage $V_{AUX}$ is proportional to the input voltage $V_{IN}$ during the on-period. A proportionality factor is given by a ratio between the number of turns of the auxiliary winding 23 and a number of turns of the primary winding $21_1$. The crossing detection voltage $V_{ZCD}$ follows the auxiliary voltage $V_{AUX}$, but has its magnitude limited by the voltage limiter explained above.

When the electronic switch 22 switches off, the current I2 through the primary winding $21_1$ rapidly decreases to zero and the energy previously stored in the transformer 21 during the on-period induces a secondary current I3 through the secondary winding $21_2$, wherein this current I3 decreases over time. When the electronic switch 22 switches off, the primary voltage $V21_1$ and, therefore, the auxiliary voltage $V_{AUX}$ change their respective polarity. That is, in the example shown in FIG. 9, the primary voltage $V21_1$ turns negative and the auxiliary voltage $V_{AUX}$ turns positive. In the off-state of the electronic switch 22, the voltage V22 across the electronic switch 22 is given by the input voltage $V_{IN}$ plus the primary voltage $V21_1$.

As the secondary current I3 decreases the transformer is demagnetized. During this demagnetization of the transformer 21 a magnitude of the primary voltage $V21_1$ is proportional to the output voltage $V_{OUT}$ plus a voltage caused by the secondary current I3 in the rectifier circuit 3. The latter, however, can be neglected for the purpose of detecting an overvoltage at the output 13, 14. Thus, during the demagnetization, the magnitude of the primary voltage $V21_1$ can be considered to be proportional to the output voltage $V_{OUT}$. A proportionality factor n is given by a ratio between a number $N_1$ of turns of the primary winding $21_1$ and a number of turns $N_2$ of the secondary winding $21_2$ ($n=N_1/N_2$). Given the proportionality between the auxiliary voltage $V_{AUX}$ and the primary voltage $V21_1$, the voltage $V_{AUX}$ is essentially proportional to the output voltage $V_{OUT}$ during the demagnetization period. Further, as explained above, the auxiliary current $I_{AUX}$ that occurs by clamping the crossing detection voltage $V_{ZCD}$ is dependent on the auxiliary voltage $V_{AUX}$ such that the auxiliary current $I_{AUX}$ increases as the auxiliary voltage $V_{AUX}$ increases.

According to one example, the voltage limiter 61 is configured to limit (clamp) the crossing detection voltage $V_{ZCD}$ to a voltage of below 500 millivolts (mV) or even below 300 mV and the auxiliary winding 23 is implemented in such a way that the auxiliary voltage $V_{AUX}$ during the demagnetization period is higher than 10V or higher than 15V (when there is no overvoltage at the output 13, 14). In this case, a magnitude of the crossing detection voltage $V_{ZCD}$ is almost negligible compared to the magnitude of the auxiliary voltage $V_{AUX}$, so that the auxiliary current $I_{AUX}$ is essentially proportional to the auxiliary voltage $V_{AUX}$. It should be noted that the crossing detection circuit 6 may be configured in such a way that the crossing detection voltage $V_{ZCD}$ is clamped even when the power converter is in a normal operating mode, that is, when no overvoltage at the output 13, 14 occurs.

Referring to FIG. 9, after the transformer 21 has been demagnetized, the magnitude of the primary voltage $V21_1$, the auxiliary voltage $V_{AUX}$, and the voltage V22 across the switch 22 (which is referred to as switch voltage V22 in the following) decreases, wherein the electronic switch 22 is again switched on after the transformer 21 has been demagnetized in order to start a new drive cycle. Referring to the above, the first reference voltage $V_{REF1}$ in the crossing detection circuit 6 is zero. In this case, the crossing detection signal $S_{ZCD}$ changes its polarity each time the auxiliary voltage $V_{AUX}$ changes its polarity. At the end of the demagnetization period, the crossing detection signal $S_{ZCD}$ changes its polarity when the primary voltage $V21_1$ and the auxiliary voltage $V_{AUX}$ turns zero. In the example illustrated in FIG. 9, the auxiliary voltage $V_{AUX}$ changes its polarity from positive to negative at the end of the demagnetization period so that the crossing detection signal $S_{ZCD}$ has a falling edge at the end of the demagnetization period. This, however, is only an example. Basically, each edge of the crossing detection signal $S_{ZCD}$ indicates that the auxiliary voltage crosses the first reference voltage $V_{REF1}$ (such as zero). The drive circuit 4 may be configured to again switch on the electronic switch 22 as soon as the crossing detection signal $S_{ZCD}$ indicates that the transformer has demagnetized. However, as illustrated in FIG. 9, it is also possible for the drive circuit 4 to wait a certain time period after the transformer has been demagnetized before again switching on the electronic switch 22. In this case, oscillations of the primary voltage $V21_1$, the auxiliary voltage $V_{AUX}$ and the voltage V22 across the electronic switch 22 may occur. Referring to FIG. 9, the voltage V22 across the electronic switch 22 regularly reaches a minimum after the transformer has been demagnetized. According to one example, the drive circuit 4 is configured to switch on the electronic switch 22 at one of those time instances at which the voltage V22 reaches a minimum. These time instances can be detected using the crossing detection signal, wherein a voltage minimum of the voltage V22 essentially occurs a quarter (¼) of the oscillation period after the auxiliary voltage $V_{AUX}$ crosses zero in a certain direction. In the example shown in FIG. 9, a minimum of the voltage V22 occurs each time after the auxiliary voltage $V_{AUX}$ turns negative, that is, after a falling edge of the crossing detection signal $S_{ZCD}$ occurs. The "oscillation period" is the period of the voltage oscillations that occur during the waiting time. This period, inter alia, is dependent on an inductance of the transformer 21 and parasitic capacitances such as a capacitance of the electronic switch 22.

Figure 10:
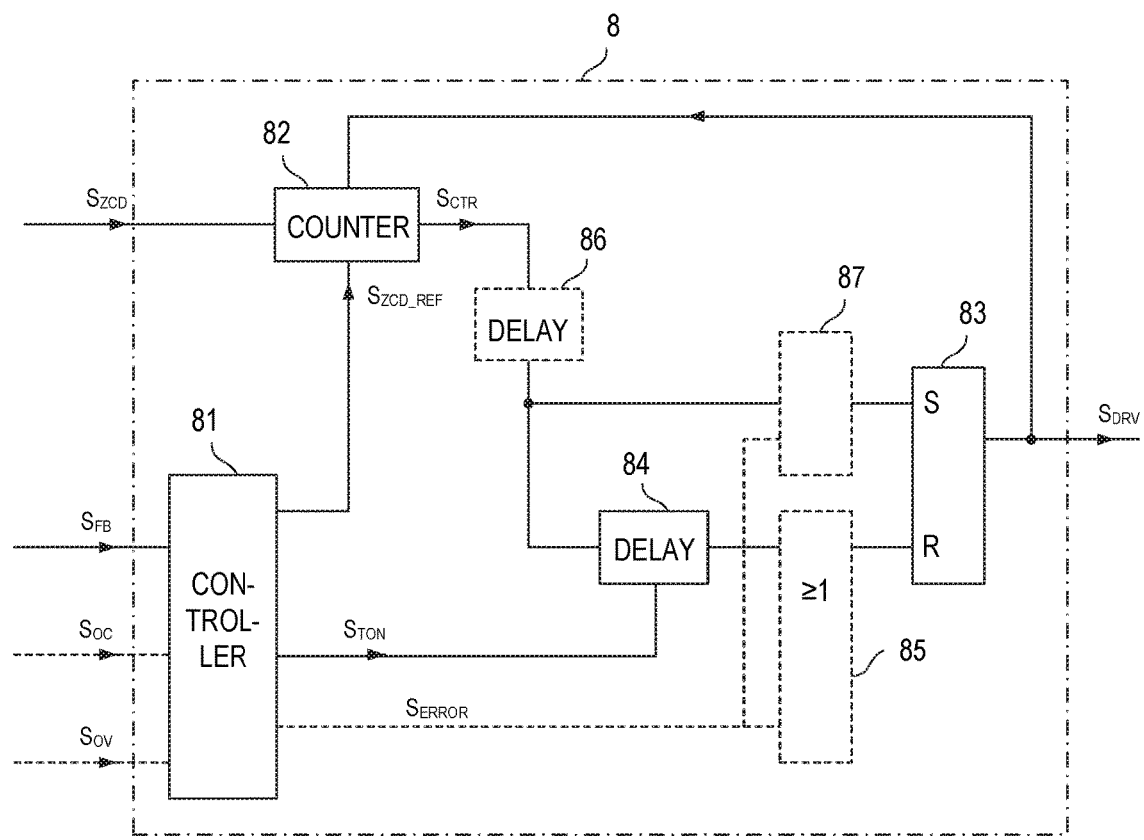
FIG. 10 shows one example of a drive signal generator included in the drive circuit according to embodiments herein.

FIG. 10 shows one example of the drive signal generator 8 in greater detail according to embodiments herein. Referring to FIG. 10, this drive signal generator 8 includes a controller 81 that receives the feedback signal $S_{FB}$ and that optionally receives the overcurrent signal $S_{OC}$ and the overvoltage signal $S_{OV}$. A counter 82 receives the crossing detection signal $S_{ZCD}$ and a reference signal $S_{ZCD\_REF}$ from the controller 81. This counter 82 is reset by the drive signal $S_{DRV}$ at the beginning of each drive cycle and is configured to count predefined edges, such as falling edges, of the crossing detection signal $S_{ZCD}$. Further, the counter 82 is configured to cause an on-level of the drive signal $S_{DRV}$ by setting a flip-flop 83 each time the number of detected edges of the crossing detection signal $S_{ZCD}$ reaches the reference value $S_{ZCD\_REF}$ provided by the controller 81. The reference value $S_{ZCD\_REF}$ defines whether the electronic switch 22 is switched on immediately after the transformer has been demagnetized or whether there is a waiting period after the demagnetization (in which the oscillations illustrated in FIG. 9 may occur) before the electronic switch 22 again switches on. If, for example, the reference value $S_{ZCD\_REF}$ is one ($S_{ZCD}$=1) the drive circuit 4 immediately switches on the electronic switch 22 after the transformer has been demagnetized. If $S_{ZCD\_REF}$ is different from one ($S_{ZCD}\neq 1$) there is a waiting time. The controller 81 is configured to adjust the reference value $S_{ZCD\_REF}$ dependent on the feedback signal $S_{FB}$ received from the feedback circuit 51. Optionally, there is a delay element 86 between the counter 82 and the flip-flop 83. This delay element 86 may provide for a delay that is given by one quarter of the oscillation period, so that the flip-flop 83 is set (and the electronic switch 22 switches on) one quarter of the oscillation period after the predefined edge of the crossing detection signal $S_{ZCD}$.

The controller 81 is further configured to adjust the duration of the on-period based on the feedback signal $S_{FB}$. In the example shown in FIG. 10, a further delay element 84 receives an on-period signal $S_{TON}$ that defines the duration of the on-period from the controller 81. This delay element 84 is connected to a reset input of the flip-flop 83 and further receives the counter signal $S_{CTR}$. This delay element 84 ensures that the flip-flop 83 is reset after a time period defined by $S_{TON}$ after the flip-flop 83 has been set.

Basically, the controller 81 may be configured to increase the reference signal $S_{ZCD\_REF}$ as the feedback signal $S_{FB}$ indicates that the power consumption of the load Z decreases. Further, at a given reference signal $S_{ZCD\_REF}$, the controller 81 may be configured to reduce the duration $T_{ON}$ of the on-periods as the power consumption of the load Z decreases. In other words, the lower the power consumption of the load Z, the higher the value represented by the reference signal $S_{ZCD\_REF}$ and/or the shorter the on-periods.

Optionally, the controller 81 receives at least one of the overcurrent signal $S_{OC}$ and the overvoltage signal $S_{OV}$ and is configured to generate an error signal $S_{ERROR}$ based on the at least one of these signals $S_{OC}$, $S_{OV}$. A logic gate 85, such as an OR gate, is optional and receives the error signal $S_{ERROR}$ and the output signal of the delay element 84. This logic element 85 is configured to reset the flip-flop 83 either when an output signal of the delay element 84 indicates that the flip-flop 83 is to be reset in order to end the on-period or when the error signal $S_{ERROR}$ indicates that an error has occurred. Optionally, another logic gate 87 that receives the error signal $S_{ERROR}$ and the counter signal $S_{CTR}$ is connected between the counter 82 and the flip-flop 83. This logic gate is configured to prevent the flip-flop 83 from being set when the error signal $S_{ERROR}$ indicates that an error has occurred. In this way, as soon as an error occurs, the on-period may be interrupted and further on-periods are prevented.

The controller 81 may generate the error signal $S_{ERROR}$ based on the overcurrent signal $S_{OC}$ and the overvoltage signal $S_{OV}$ in different ways. When, for example, the overcurrent signal $S_{OC}$ indicates an overcurrent the controller 81 may be configured to generate the error signal $S_{ERROR}$ such that it has an error signal for a short time period that causes the flip-flop 83 to be reset, but does not prevent a further switched-mode operation of the power converter. When, for example, the overvoltage signal $S_{OV}$ indicates an error, the controller 81 may generate an error level of the error signal $S_{ERROR}$ for a time period that is long enough to interrupt the switched-mode operation of the power converter for a certain time period. The controller 81 may reset the error signal $S_{ERROR}$ after a certain period. Alternatively, the error signal $S_{ERROR}$ is only reset after the drive circuit 4 has been reset. "Resetting" the drive circuit 4 may include interrupting the supply voltage VDD of the drive circuit 4.

The invention claimed is:

1. A method comprising:
   driving an electronic switch based on a feedback signal and a received voltage, the electronic switch coupled to an inductor in a power converter, the feedback signal being dependent on an output parameter of the power converter, the received voltage being dependent on an auxiliary voltage supplied by an auxiliary winding magnetically coupled to the inductor;
   clamping the received voltage to produce an auxiliary current associated with the clamping of the received voltage;
   monitoring a magnitude of the auxiliary current;
   detecting an overvoltage condition with respect to the output parameter based on detecting that the magnitude of the auxiliary current reaches a predefined threshold;
   the method further comprising: monitoring a first current through the electronic switch when the electronic switch is in an on-state, the first current determined from a first voltage across a first resistor connected in series with the electronic switch; and
   wherein monitoring the auxiliary current comprises: monitoring a magnitude of the auxiliary current when the electronic switch is in an off-state;
   wherein monitoring the auxiliary current further comprises:
      driving a second current through the first resistor and a second resistor, the second resistor coupled to the first resistor, the second current being dependent on the magnitude of the auxiliary current; and
      monitoring a second voltage, the second voltage being across the first resistor and the second resistor.

2. The method as in claim 1, wherein clamping the received voltage comprises limiting a voltage across the auxiliary winding to a voltage level of below 500 mV.

3. The method as in claim 1, wherein detecting the overvoltage condition comprises detecting the overvoltage condition based on detecting that the magnitude of the auxiliary current is greater than a predefined threshold for longer than a predefined time period.

4. The method as in claim 3, wherein driving the electronic switch comprises driving the electronic switch for a plurality of successive drive cycles; and
   wherein detecting the overvoltage condition comprises detecting the overvoltage condition in response to detecting that the magnitude of the auxiliary current is greater than the predefined threshold in each of a predefined number of successive drive cycles.

5. The method as in claim 1, wherein the inductor is a winding of a transformer.

6. The method as in claim 1, wherein driving the electronic switch includes driving the electronic switch for multiple drive cycles; and
   wherein detecting the overvoltage condition includes detecting the overvoltage condition in response to detecting that the magnitude of the auxiliary current is greater than the predefined threshold in each of the multiple drive cycles of controlling the electronic switch.

7. The method as in claim 1 further comprising:
reducing a magnitude of current through the inductor in response to detecting the overvoltage condition.

8. An apparatus comprising:
a drive circuit operative to:
drive an electronic switch based on: i) a feedback signal received at a first input of the drive circuit, and ii) a first voltage received at a second input of the drive circuit, the electronic switch connected in series with an inductor of a power converter, the first voltage being dependent on a magnitude of an auxiliary voltage supplied by an auxiliary winding, the auxiliary winding magnetically coupled to the inductor;
clamp the first voltage to a predefined threshold;
monitor a magnitude of an auxiliary current associated with clamping the first voltage, the auxiliary current being a first current; and
detect an overvoltage condition with respect to the power converter based on detecting that the magnitude of the auxiliary current reaches a predefined threshold;
the drive circuit further operative to:
monitor a current through the electronic switch when the electronic switch is in an on-state, the current through the electronic switch determined from a second voltage across a first resistor connected in series with the electronic switch; and
monitor a magnitude of the auxiliary current when the electronic switch is in an off-state;
the drive circuit further operative to:
drive a second current, the second current being dependent on the magnitude of the auxiliary current, the second current driven through the first resistor and a second resistor, the second resistor coupled to the first resistor; and
monitor a third voltage across the first resistor and the second resistor.

9. The apparatus as in claim 8, wherein the drive circuit comprises an integrated circuit.

10. The apparatus as in claim 8, wherein the inductor is a primary winding of a transformer.

11. An apparatus comprising:
a drive circuit operative to control operation of an electronic switch, a state of the electronic switch controlling main current through a primary winding of a transformer, a secondary winding of the transformer producing an output voltage of a power converter, the drive circuit further operative to:
control operation of the electronic switch based on: i) a feedback signal associated with generating the output voltage, and ii) an auxiliary voltage received from an auxiliary winding of the transformer, the auxiliary winding magnetically coupled to the primary winding;
clamp the auxiliary voltage to a predefined threshold;
monitor a magnitude of an auxiliary current associated with clamping the auxiliary voltage; and
detect an overvoltage condition of the power converter based on detecting that the magnitude of the monitored auxiliary current reaches a predefined threshold;
the drive circuit further operative to:
drive a second current through a first resistor and a second resistor, the second resistor coupled to the first resistor; and
monitor a voltage across the first resistor and the second resistor.

12. The apparatus as in claim 11, wherein the feedback signal is the output voltage.

13. The apparatus as in claim 11, wherein the drive circuit is further operative to:
control operation of the electronic switch based on a magnitude of the main current through the primary winding.

14. The apparatus as in claim 11, wherein the drive circuit is further operative to:
reduce a magnitude of the main current through the primary winding in response to detecting the overvoltage condition.

15. The apparatus as in claim 11, wherein the clamped auxiliary voltage is a current measurement signal.

16. The apparatus as in claim 15, wherein the drive circuit includes a comparator operative to compare the current measurement signal to a reference signal to determine the overvoltage condition.

17. The apparatus as in claim 11, wherein the magnitude of the auxiliary current is proportional to a magnitude of the auxiliary voltage.

18. The apparatus as in claim 11, wherein the drive circuit is further operative to detect that a magnitude of the auxiliary current is greater than a predefined threshold for a duration of time in each of multiple drive cycles of controlling the electronic switch.

* * * * *